United States Patent [19]

Enomoto

[11] Patent Number: 5,479,412
[45] Date of Patent: Dec. 26, 1995

[54] APPARATUS FOR TESTING COUNTER CIRCUIT

[75] Inventor: Toshio Enomoto, Tokyo, Japan

[73] Assignee: NEC Corporation, Tokyo, Japan

[21] Appl. No.: 12,322

[22] Filed: Feb. 2, 1993

[30] Foreign Application Priority Data

Feb. 3, 1992 [JP] Japan ................................ 4-017400

[51] Int. Cl.$^6$ ...................................................... H04B 17/00
[52] U.S. Cl. ........................ 371/22.1; 371/20.4; 371/27; 371/24; 377/29; 377/39
[58] Field of Search ................. 371/27, 20.1, 20.4, 371/22.1, 24, 22.4, 22.5; 377/27–29, 31, 32, 47, 48, 52, 39, 93, 107, 108; 324/766.1–766.3, 763, 764, 527, 73.1; 348/180, 181

[56] References Cited

U.S. PATENT DOCUMENTS

| | | | |
|---|---|---|---|
| 4,048,481 | 9/1977 | Bailey, Jr. et al. | 371/16.1 |
| 4,189,635 | 2/1980 | Sheller | 377/29 |
| 4,604,744 | 8/1986 | Littlebury et al. | 371/27 |
| 4,975,931 | 12/1990 | Cosand | 377/52 |
| 5,151,903 | 9/1992 | Mydill et al. | 371/27 |
| 5,170,398 | 12/1992 | Fujieda et al. | 371/24 |
| 5,222,110 | 6/1993 | Holzinger et al. | 377/47 |
| 5,305,331 | 4/1994 | Sato et al. | 371/27 |
| 5,337,045 | 8/1994 | Shirasaka | 371/27 |

*Primary Examiner*—Ellis B. Ramirez
*Assistant Examiner*—Hal D. Wachsman
*Attorney, Agent, or Firm*—Whitham, Curtis, Whitham & McGinn

[57] ABSTRACT

In an apparatus for testing a counter circuit, a test pattern is used to drive the counter circuit to obtain an output pattern. The output pattern is compared with an expected pattern in synchronization with the test pattern, thereby determining whether or not the counter circuit is normal. A phase between the output pattern and the expected pattern is initially adjusted by the testing apparatus.

6 Claims, 16 Drawing Sheets

Fig. 2

| ADDRESS | DRIVING DATA | RESET DATA | EXPECTED DATA |
|---|---|---|---|
| 0 | 0 | 1 | 1 |
| 1 | 1 | 1 | 1 |
| 2 | 0 | 0 | 1 |
| 3 | 1 | 0 | 0 |
| 4 | 0 | 0 | 0 |
| 5 | 1 | 0 | 1 |
| 6 | 0 | 0 | 1 |
| 7 | 1 | 0 | 0 |
| 8 | 0 | 0 | 0 |
| 9 | 1 | 0 | 1 |
| 10 | 0 | 0 | 1 |
| 11 | 1 | 0 | 0 |
| 12 | 0 | 0 | 0 |
| 13 | 1 | 0 | 1 |
| 14 | 0 | 0 | 1 |
| 15 | 1 | 0 | 0 |
| 16 | 0 | 0 | 0 |
| 17 | 1 | 0 | 1 |
| ⋮ | ⋮ | ⋮ | ⋮ |

Fig. 5

| ADDRESS | DRIVING DATA | EXPECTED DATA | BRANCH DATA | MASK DATA |
|---|---|---|---|---|
| 0 | 0 | 1 | 0 | 0 |
| 1 | 1 | 1 | 0 | 0 |
| 2 | 0 | 1 | 1 | 0 |
| 3 | 1 | 0 | 0 | 1 |
| 4 | 0 | 0 | 0 | 1 |
| 5 | 1 | 1 | 0 | 1 |
| 6 | 0 | 1 | 0 | 1 |
| 7 | 1 | 0 | 0 | 1 |
| 8 | 0 | 0 | 0 | 1 |
| 9 | 1 | 1 | 0 | 1 |
| 10 | 0 | 1 | 0 | 1 |
| 11 | 1 | 0 | 0 | 1 |
| 12 | 0 | 0 | 0 | 1 |
| 13 | 1 | 1 | 0 | 1 |
| 14 | 0 | 1 | 0 | 1 |
| 15 | 1 | 0 | 0 | 1 |
| 16 | 0 | 0 | 0 | 1 |
| 17 | 1 | 1 | 0 | 1 |
| ⋮ | ⋮ | ⋮ | ⋮ | ⋮ |

Fig. 12

| ADDRESS | DRIVING DATA | EXPECTED DATA | BRANCH DATA | MASK DATA |
|---|---|---|---|---|
| 0 | 0 | 0 | 0 | 0 |
| 1 | 1 | 0 | 0 | 0 |
| 2 | 0 | 0 | 0 | 0 |
| 3 | 1 | 0 | 0 | 0 |
| 4 | 0 | 0 | 1 | 0 |
| 5 | 1 | 1 | 0 | 1 |
| 6 | 0 | 1 | 0 | 1 |
| 7 | 1 | 1 | 0 | 1 |
| 8 | 0 | 1 | 0 | 1 |
| 9 | 1 | 0 | 0 | 1 |
| 10 | 0 | 0 | 0 | 1 |
| 11 | 1 | 0 | 0 | 1 |
| 12 | 0 | 0 | 0 | 1 |
| 13 | 1 | 1 | 0 | 1 |
| 14 | 0 | 1 | 0 | 1 |
| 15 | 1 | 1 | 0 | 1 |
| 16 | 0 | 1 | 0 | 1 |
| 17 | 1 | 0 | 0 | 1 |
| ⋮ | ⋮ | ⋮ | ⋮ | ⋮ |

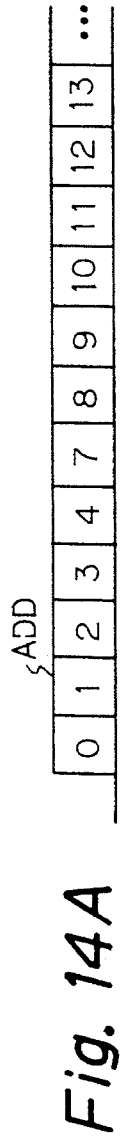

APPARATUS FOR TESTING COUNTER CIRCUIT

BACKGROUND OF THE INVENTION

1. Field of the Invention

The present invention relates to an apparatus for testing a counter circuit such as a prescaler which is included in an integrated circuit (IC).

2. Description of the Related Art

A prior art IC tester for a counter circuit includes a pattern memory which stores a test pattern and an expected pattern. The counter circuit is driven by using the test pattern, and as a result, the output pattern obtained from the counter circuit is compared with the expected pattern. Thus, a determination of whether the counter circuit is normal or abnormal is made based on whether or not the obtained output pattern coincides with the expected patter.

In the above-mentioned prior art tester, however, in order to initially phase the output pattern with the expected pattern, a reset element has to be provided within the counter circuit, which increases the number of terminal (pads), thus enlarging the size of the counter circuit. Also, since such a reset element within the counter circuit serves as a relatively large load on the counter circuit, it is impossible to drive the counter circuit at a high speed.

SUMMARY OF THE INVENTION

It is an object of the present invention to provide an apparatus for testing a counter circuit, thereby to reduce the counter circuit in size and enable it, to operate at a high speed.

According to the present invention, in an apparatus for testing a counter circuit, a test pattern is used to drive the counter circuit to obtain an output pattern. The output pattern is compared with an expected pattern in synchronization with the test pattern, thereby determining whether or not the counter circuit is normal. A phase between the output pattern and the expected pattern is initially adjusted by the testing apparatus. Thus, a reset element is unnecessary in the counter circuit.

BRIEF DESCRIPTION OF THE DRAWINGS

The present invention will be more clearly understood from the description as set forth below, compared with the prior art, with reference to the accompanying drawings, wherein:

FIG. 2 is a diagram showing the content of the pattern memory of FIG. 1;

FIG. 5 is a diagram showing the content of the pattern memory of FIG. 4;

FIG. 12 is a diagram showing the content of the pattern memory of FIG. 11;

FIG. 13A through 13I and FIGS. 14A through 14I are timing diagrams showing the operation of the testing apparatus of FIG. 11;

DESCRIPTION OF THE PREFERRED EMBODIMENTS

Before the description of embodiments of the present invention, a prior art testing apparatus will be explained with reference to FIGS. 1, 2 and 3A through 3G.

Figure 1:
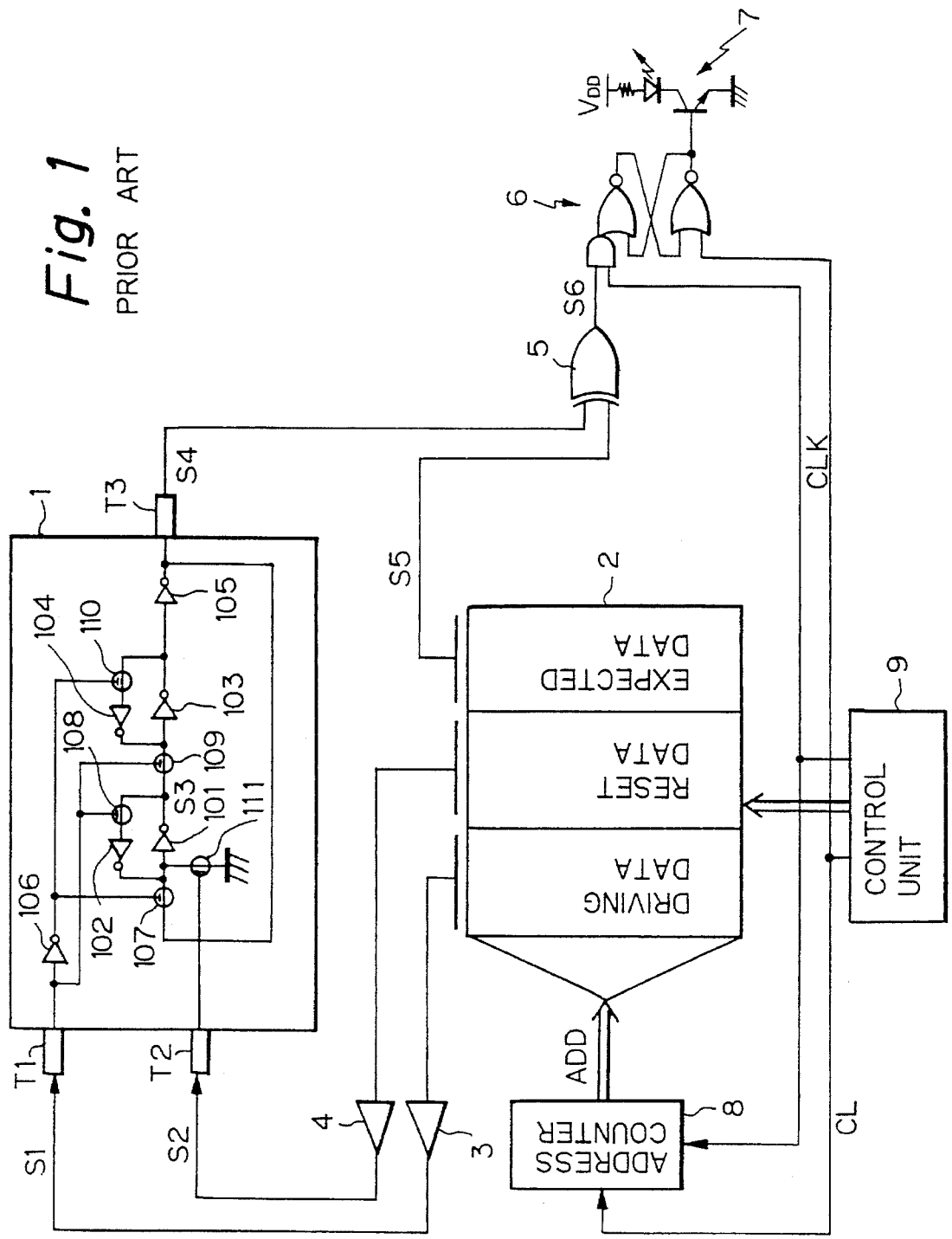
FIG. 1 is a circuit diagram illustrating a prior art testing apparatus for a counter circuit.

FIG. 1, reference numeral 1 designates a ½ counter formed by inverters 101 to 106 and switches 107 through 110 which are CMOS transfer gates or the like. The ½ counter 1 also includes a reset element 111 which is an NMOS transistor or the like, and as a result, the ½ counter 1 is initially reset by turning ON the reset element 111.

In order to perform a test upon the counter circuit 1, driving data is read out of a pattern memory 2, so that a driving pattern signal S1 based upon the driving data is supplied via a driver 3 to a terminal (pad) T1 of the counter circuit 1. In this case, however, reset data is also read out of the pattern memory 2, so that a reset pattern signal S2 based upon the reset data is supplied via a driver 4 to a terminal (pad) T2 of the counter circuit 1. Therefore, an output pattern signal S4 is obtained at a terminal (pad) T3 of the counter circuit 1, and as a result, the output pattern signal 4 is compared with an expected pattern signal S5 based upon expected data of the pattern memory 2 by an exclusive OR circuit (comparator) 5. For example, when the output pattern signal S4 coincides with the expected pattern signal S5, the output signal S6 of the exclusive OR circuit 5 is made low, thus deactivating an alarm 7 via a latch circuit (RS flip-flop) 6. Contrary to this, when the output pattern signal S4 does not coincide with the expected pattern signal S5, the output signal S6 of the exclusive OR circuit 5 is made high, thus activating the alarm 7 via the latch circuit 6.

Also, in FIG. 1, reference numeral 8 designates an address counter for generating an address ADD for accessing the pattern memory 2, and reference numeral 9 designates a control unit for controlling the entire testing apparatus of FIG. 1. The control unit 9 is formed by a microcomputer or the like.

Figure 3:
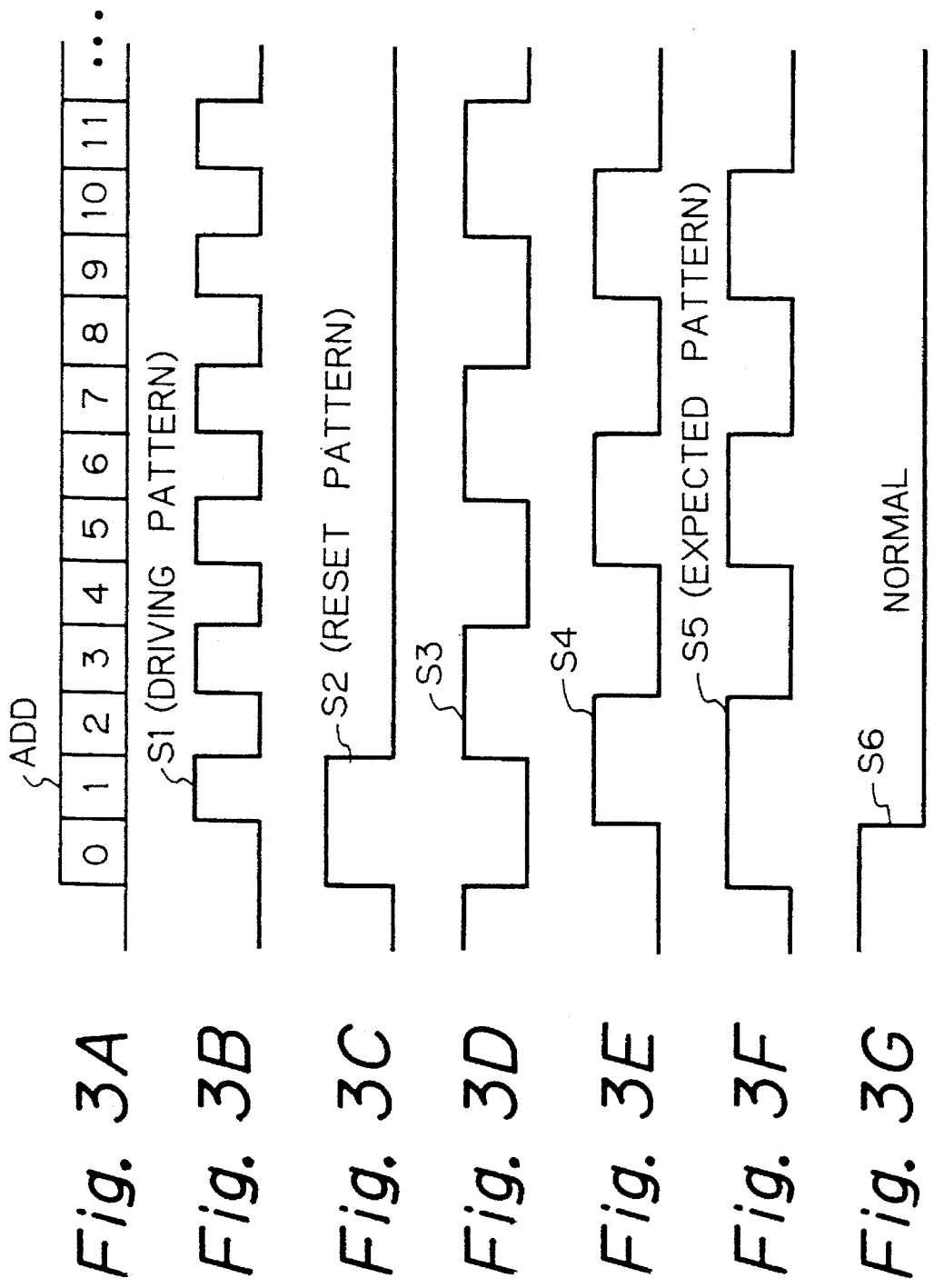
FIG. 3A through 3G are timing diagrams showing the operation of the testing apparatus of FIG. 1.

An example of the content of the pattern memory 2 is shown in FIG. 2. In this case, when the control unit 9 clears the latch circuit 6 and the address counter 8 by a clear signal CL and increases the content of the address counter 8 by a clock signal CLK, as shown in FIG. 3A, the driving pattern signal S1 and the reset pattern signal S2 are changed as shown in FIGS. 3B and 3C, respectively. That is, due to the high level of the reset pattern signal S2 at ADD=0 and 1, an output signal of the inverter 102 and the output pattern signal S4 are initialized at a high level and a low level, respectively, at ADD=2, as shown in FIGS. 3D and 3E. Thus, after a reset operation is released, the output pattern signal S4 can completely be in-phase with the expected pattern signal S5 as shown in FIGS. 3E and 3F. In this case, the counter circuit 2 is normal, and therefore, the output signal S6 of the exclusive OR circuit 5 remains low as shown in FIG. 3G.

In the testing apparatus of FIG. 1, however, the reset element 111 has to be provided within the counter circuit 1, and as a result, since the reset element 111 is a relatively large load on the counter circuit 1, the counter circuit 1 cannot be operated at a high speed. Also, the presence of the reset element 111 including the terminal T2 increases the counter circuit 1 in size.

Figure 4:
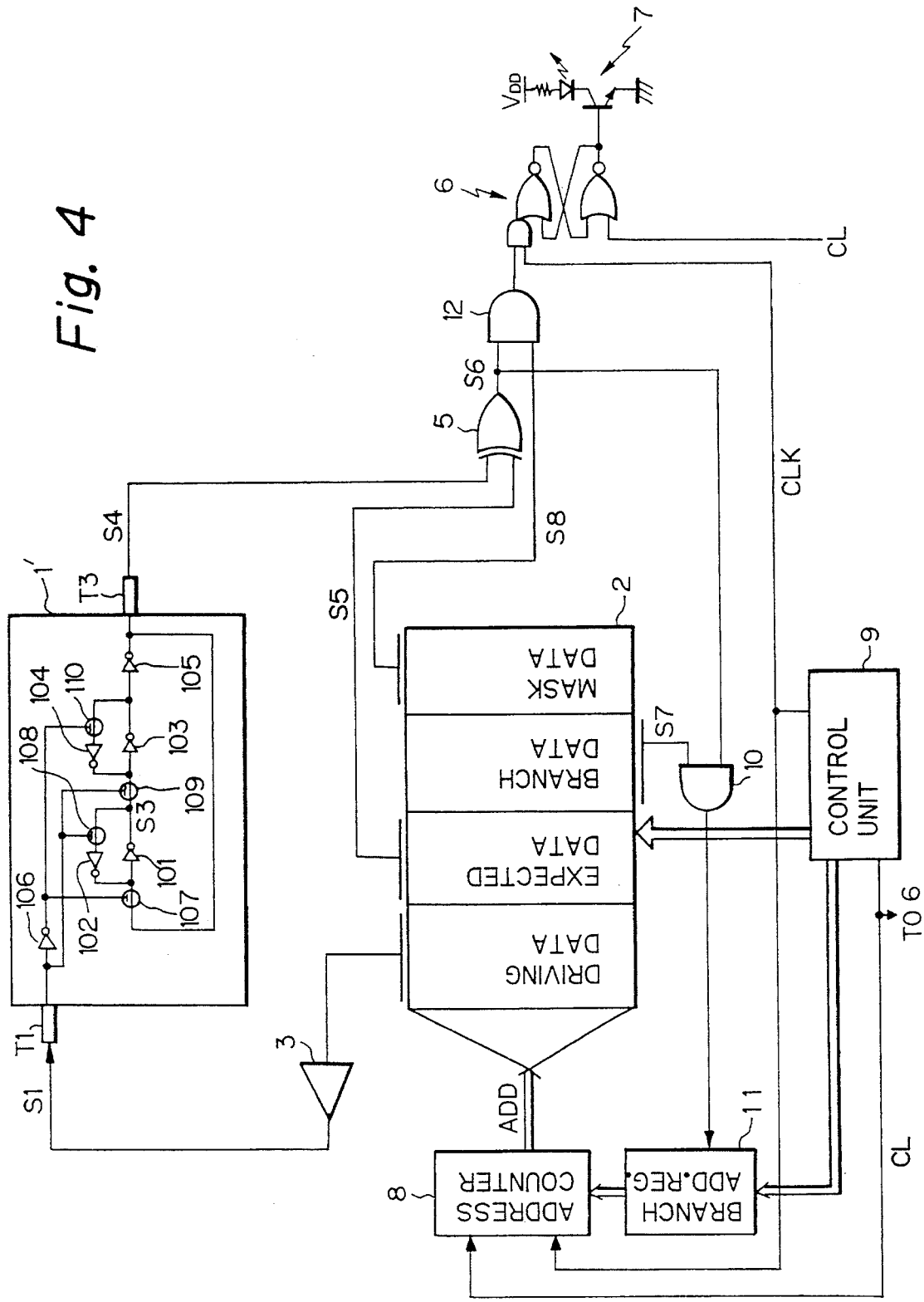
FIG. 4 is a circuit diagram illustrating a first embodiment of the testing apparatus for a counter circuit according to the present invention.

In FIG. 4, which illustrates a first embodiment of the present invention, a counter circuit 1' does not include the reset element 111 and the terminal T2 of FIG. 1. Instead of this, in order to initially phase the output pattern signal S3 of the counter circuit 1' with the expected pattern signal S5 of the pattern memory 2, branch data is stored in the pattern memory 2, and an AND circuit (branch determining circuit) 10 and a branch address register 11 are added. Also, mask data is stored in the pattern memory 2, and an AND circuit 12 is added to mask the latch circuit 6 in accordance with the mask data when an initial phasing function is carried out.

An example of the content of the pattern memory 2 of FIG. 4 is shown in FIG. 5. In FIG. 5, the period of the expected data is twice that of the driving data, and a branch determining address is 1. Also, a branch address is 1.

The operation of the testing apparatus of FIG. 4 will be explained with reference to FIG. 6, FIGS. 7A through 7H, and FIGS. 8A through 8H.

Figure 6:
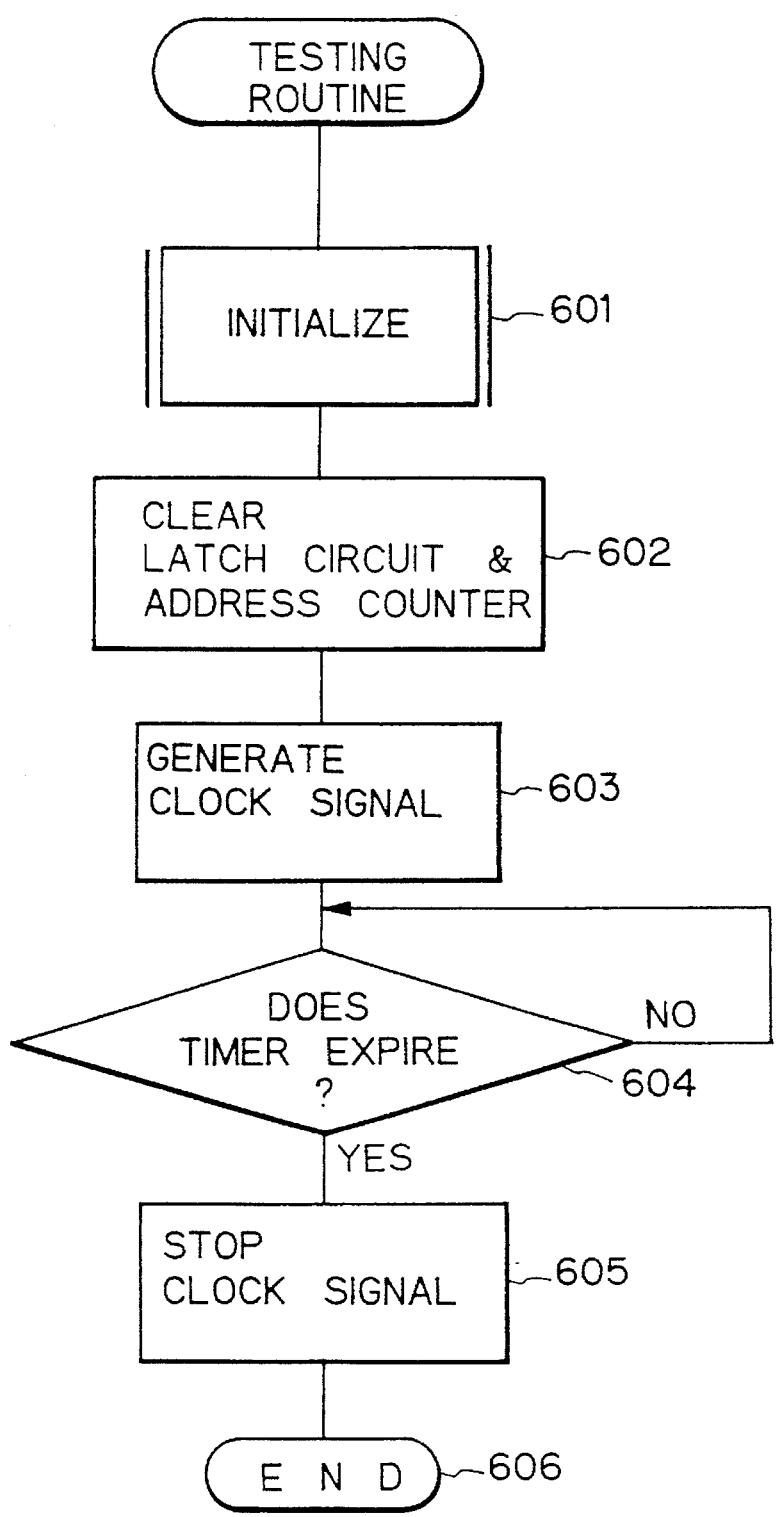
FIG. 6 is a flowchart showing the operation of the control unit of FIG. 4.

Referring to FIG. 6 which is a routine showing the operation of the control unit 9, at step 601, an initialization is carried out. For example, data is written into the pattern memory 2, a branch address which is, in this case, 1, is written into the branch address register 11. At step 602, the control unit 9 generates a clear signal CL and transmits it to the latch circuit 6 and the address counter 8, thus clearing the content thereof. Then, at step 603, the control unit 9 generates a clock signal CLK to increase the content of the address counter 8.

In the apparatus of FIG. 4, since the reset element 111 of FIG. 1 is not provided, there are two initial states: a first state where the output signal S3 of the inverter 101 and the output pattern signal S4 of the counter 1' are low and high, respectively, and a second state where the output signal S3 of the inverter 101 and the output pattern signal S4 of the counter 1' are high and low, respectively.

First, it is considered that the initial potentials of the output signal S3 of the inverter 101 and the output pattern signal S4 of the counter circuit 1' are low and high, respectively. In this case, the operation of the testing apparatus of FIG. 4 is shown in FIGS. 7A through 7H. That is, the content ADD of the address counter 8 is changed as shown in FIG. 7A, and therefore, the driving pattern signal S1 is changed as shown in FIG. 7B. As a result, the signals S3 and S4 are changed as shown in FIGS. 7C and 7D, respectively. When the address ADD reaches 2, the branch pattern signal S7 is high as shown in FIG. 7G. However, since the output signal S6 of the exclusive OR circuit 5 is low due to the coincidence between the signals S4 and S5 as shown in FIG. 7F, the output of the AND circuit 10 is low, so that the content of the branch address register 11 is not written into the address counter 8. Thus, the content of the address counter 8 is not branched, as shown in FIG. 7A, and accordingly, as shown in FIG. 7H, thereafter a mask pattern signal S8 based upon the mask data of the pattern memory 2 becomes high to determine whether or not the counter circuit 1'is normal. In more detail, when ADD=0, 1 and 2, the mask data is 0, and accordingly, the output signal S6 of the exclusive OR circuit 5 is masked by the AND circuit 12, to thereby make the output signal thereof low. After ADD has reached 3, the mask data is 1, and accordingly, the output signal S6 of the exclusive OR circuit 5 is transmitted to the latch circuit 6. For example, when the counter circuit 1' is normal, the signal S4 equals the signal S5, so that the output signal of the exclusive OR circuit 5 is low and the state of the latch circuit 6 is unchanged, thus deactivating the alarm 7.

Figure 8:
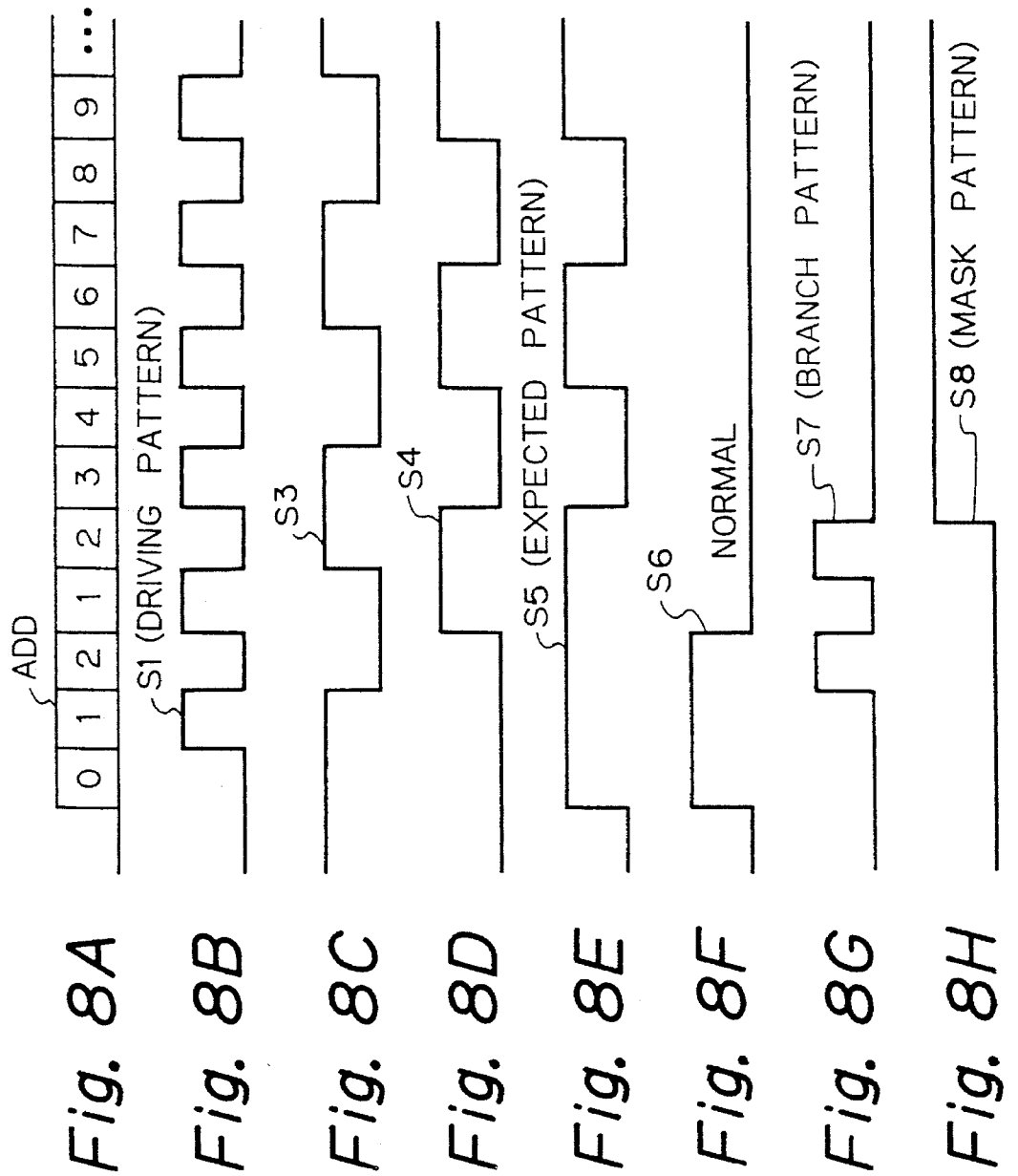

Next, it is considered that the initial potentials of the output signal S3 of the inverter 101 and the output pattern signal S4 of the counter circuit 1' are high and low, respectively. In this case, the operation of the testing apparatus of FIG. 4 is shown in FIG. 8A through 8H. That is, the content ADD of the address counter 8 is changed as shown in FIG. 8A, and therefore, the driving pattern signal S1 is changed as shown in FIG. 8B. As a result, the signals S3 and S4 are changed as shown in FIGS. 8C and 8D, respectively. When the address ADD reaches 2, the branch pattern signal S7 is high as shown in FIG. 8G. In this case, since the output signal S6 of the exclusive OR circuit 5 is high due to the non coincidence between the signals S4 and S5 as shown in FIG. 8F, the output of the AND circuit 10 is high, so that the content of the branch address register 11, i.e., 1 is written into the address counter 8. Thus, the content of the address counter 8 is branched from 2 to 1, as shown in FIG. 8A, and accordingly, as shown in FIG. 8H, the mask pattern signal S8 based upon the mask data of the pattern memory 2 is made high with a delay to determine whether or not the counter circuit 1' is normal. In more detail, again when ADD=1 and 2, the mask data is 0, and accordingly, the output signal S6 of the exclusive OR circuit 5 is masked by the AND circuit 12, to thereby make the output signal thereof low. After ADD has reached 3, the mask data is 1, and accordingly, the output signal S6 of the exclusive OR circuit 5 is transmitted to the latch circuit 6. For example, when the counter circuit 1' is normal, the signal S4 equals the signal S5, so that the output signal of the exclusive OR circuit 5 is low and the state of the latch circuit 6 is unchanged, thus deactivating the alarm 7.

Again, in FIG. 6, at step 604, it is determined whether or not a predetermined time period has passed. Only when the predetermined time period has passed, does the control proceed to step 605 which stops the generation of the clock signal CLK, thus completing the routine of FIG. 6 by step 606.

Thus, according to the first embodiment as illustrated in FIG. 4, a phasing function between the output pattern signal S4 and the expected pattern signal S5 is initially carried out by introducing a branch address into the address counter 8. Therefore, even when the output pattern signal S4 and the expected pattern signal S5 are out of phase, they are automatically in phase at an initial stage of operation.

Figure 9:
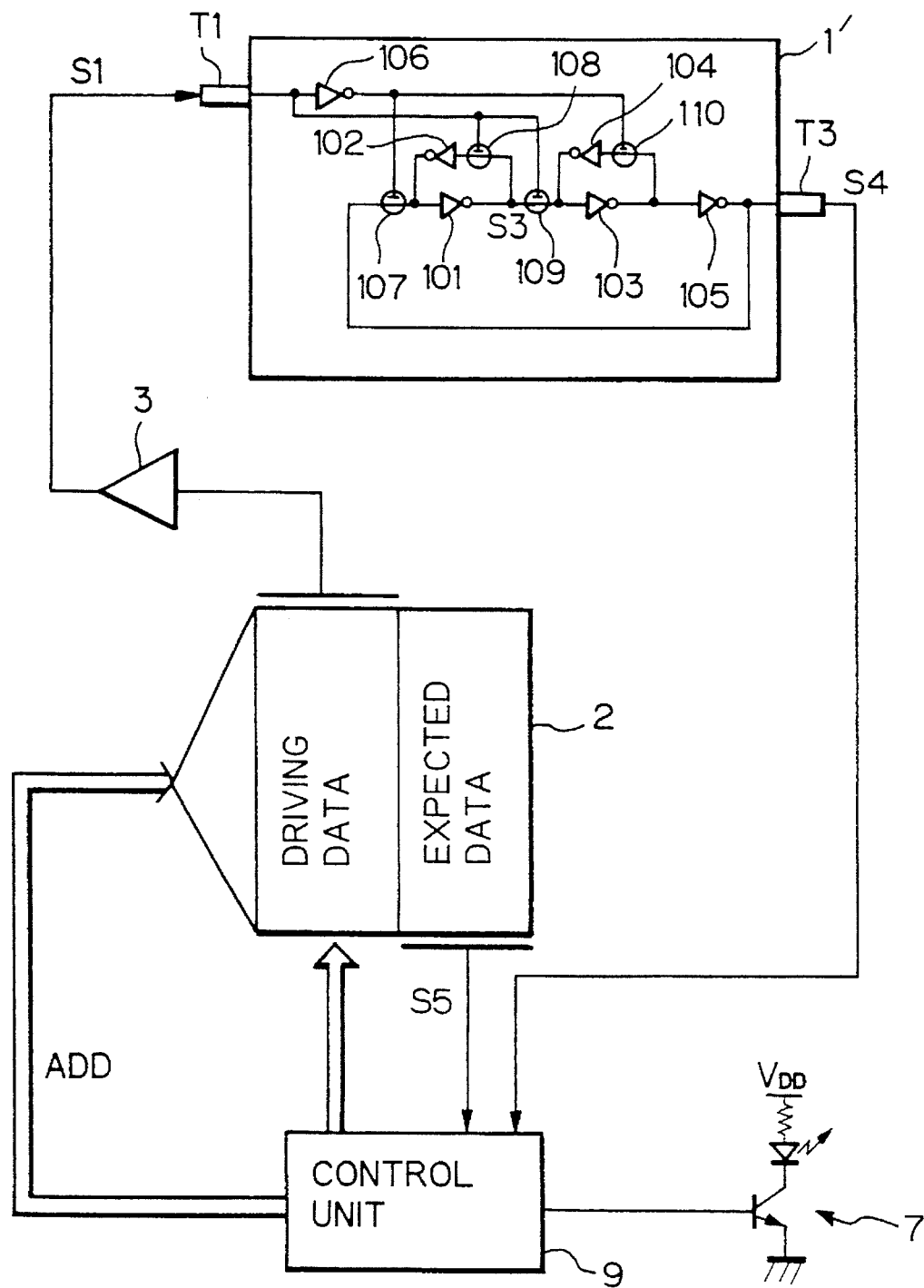
FIG. 9 is a circuit diagram illustrating a second embodiment of the testing apparatus for a counter circuit according to the present invention.

In FIG. 9, which illustrates a second embodiment of the present invention, the exclusive OR circuit 5, the latch circuit 6, the address counter 8, the AND circuit 10, the branch address register 11 and the AND circuit 12 of FIG. 4 are functionally introduced into the control unit 9, i.e., the operation of this hardware is carried out by software. Also, the branch data and mask data of the pattern memory 2 are functionally introduced into the control unit 9.

Figure 10:
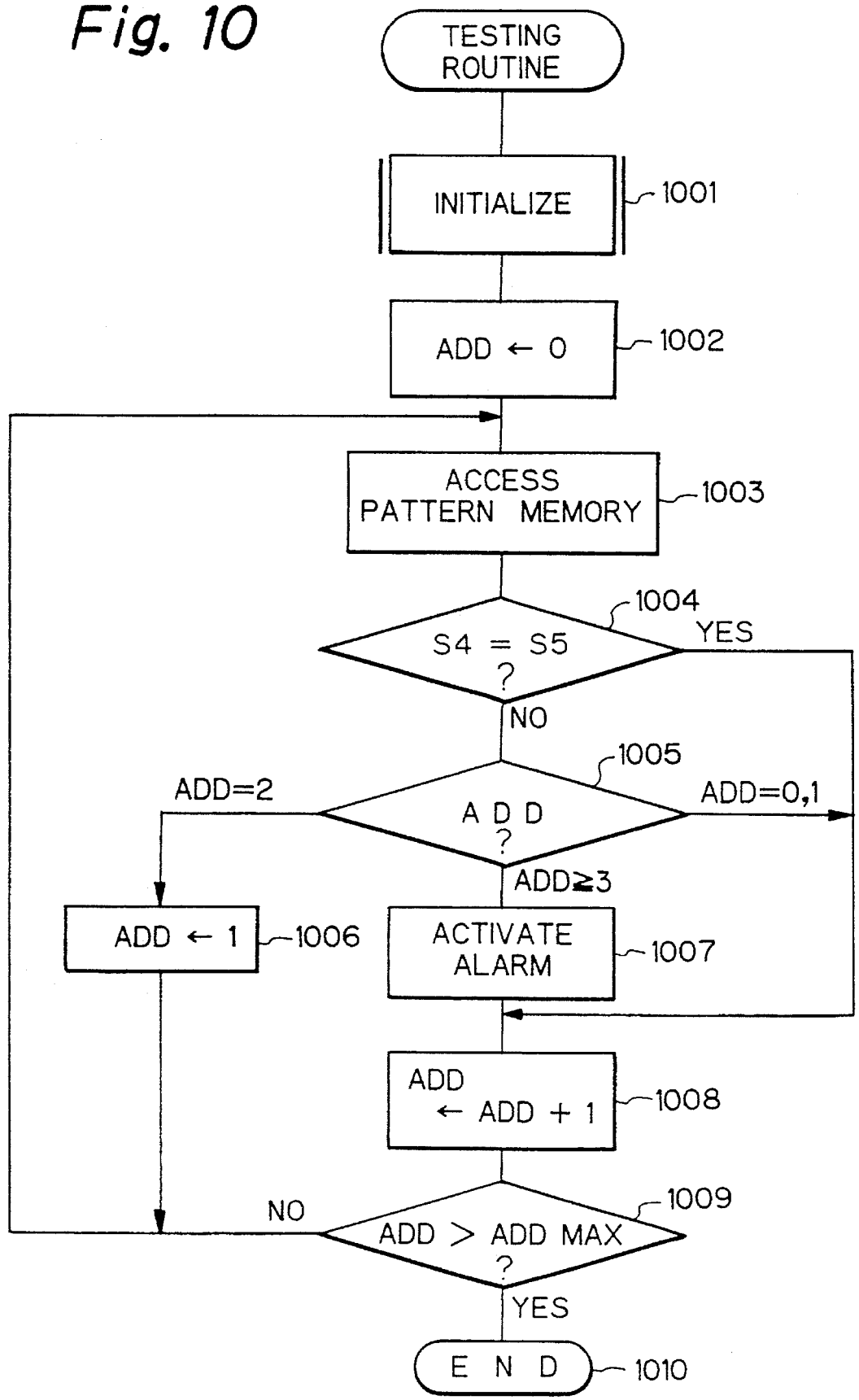
FIG. 10 is a flowchart showing the operation of the control unit of FIG. 9.

The operation of the control unit 9 of FIG. 9 is explained with reference to FIG. 10. At step 1001, an initialization is carried out. For example, data is written into the pattern memory 2. At step 1002, an address counter ADD is cleared.

At step 1003, the pattern memory 2 is accessed by using the value ADD, to generate a driving pattern signal S1 as shown in FIG. 7B or 8B. As a result, the counter circuit 1' is operated to generate an output pattern signal S4 as shown in FIG. 7D or 8D.

At step 1004, it is determined whether or not the output pattern signal S4 coincides with the expected pattern signal S5, i.e., they are in phase to each other. If S4=S5, the control proceeds to step 1008. Otherwise, the control proceeds to step 1005.

At step 1005, the value of the address counter ADD is determined. When ADD=0 or 1, the control proceeds to step 1008. When ADD=2, the control proceeds to step 1006 which makes the value of the address counter ADD the branch address which is, in this case, 1, and then, the control returns to step 1003. When ADD is larger than 2, the control proceeds to step 1007 which activates the alarm 7, thus indicating that the counter circuit 1' is abnormal. Then, the control proceeds to step 1008.

At step 1008, the value of the address counter ADD is counted up by +1. Then at step 1009, it is determined whether or not the value of the address counter ADD reached a maximum value ADDMAX. When ADD≦ADDMAX, the control returns to step 1003, thus repeating the above-mentioned operation. Otherwise, the control proceeds to step 1010, thus completing the routine of FIG. 10.

Thus, the testing apparatus of FIG. 9 can be operated in the same way as the testing apperatus of FIG. 4.

Figure 11:
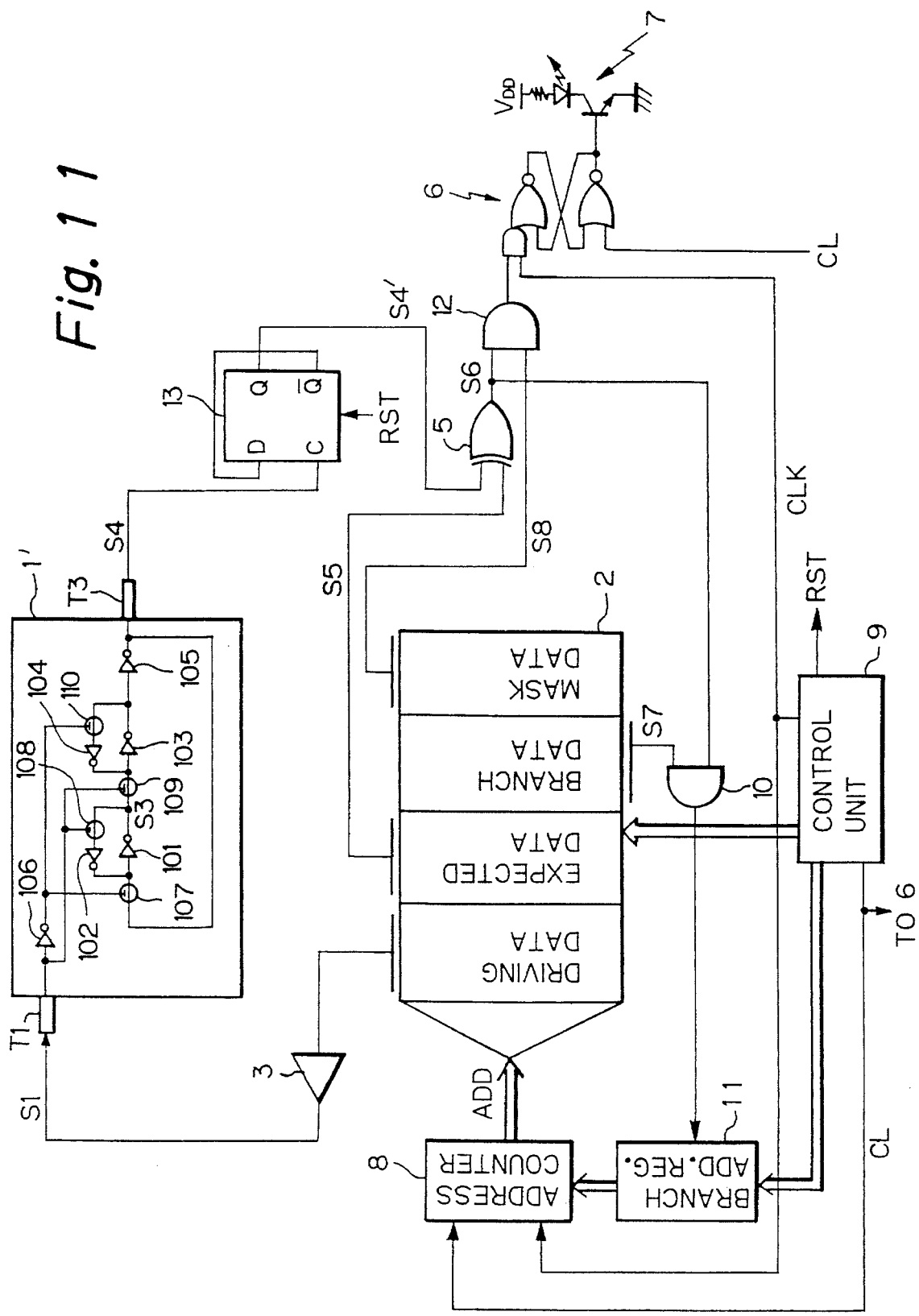
FIG. 11 is a circuit diagram illustrating a third embodiment of the testing apparatus for a counter circuit according to the present invention.

In FIG. 11, which illustrates a third embodiment of the present invention, a clocked D flip-flop 13 which serves as a ½ counter, (frequency divider) is added to the elements of FIG. 4, to follow the operation of the counter circuit 1', even when the counter circuit 1' is operated at a higher speed. The D flip-flop 13 is reset by a reset signal RST from the control unit 9. That is, when the counter circuit 1' is operated at a higher speed, the post stages such as the exclusive OR circuit 5, the AND circuit 12 and the latch circuit 6 may not follow the output pattern signal S4 of the counter circuit 1', thereby to invite a misoperation. In order to avoid such a misoperation, the ½ counter 13 is provided.

An example of the content of the pattern memory 2 of FIG. 11 is shown in FIG. 12. In FIG. 12, the period of the expected data is four times that of the driving data, and a branch determining address is 4. Also, a branch address is 7.

The operation of the control unit 9 is also shown in FIG. 6. In this case, at step 601, the D flip-flop 13 is reset by generating the reset signal RST.

Figure 7:
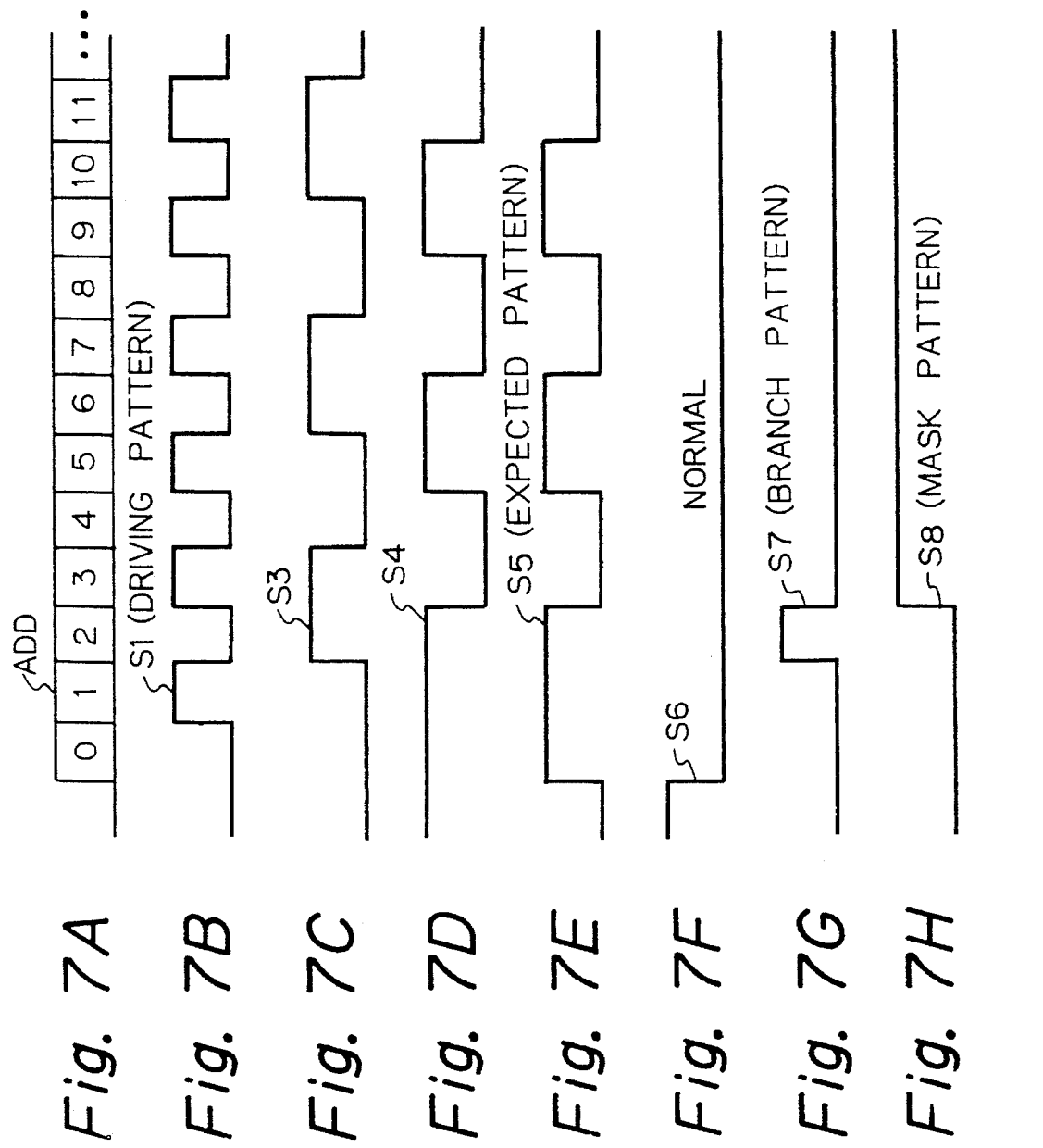
FIGS. 7A through 7H and FIGS. 8A through 8H are timing diagrams showing the operation of the testing apparatus of FIG. 4.
Figure 13A:
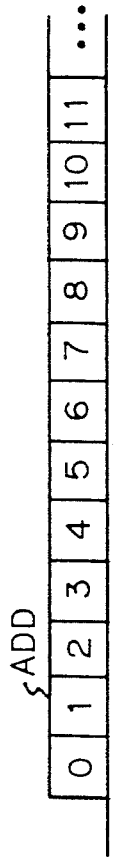
Figure 13B:
Figure 13C:
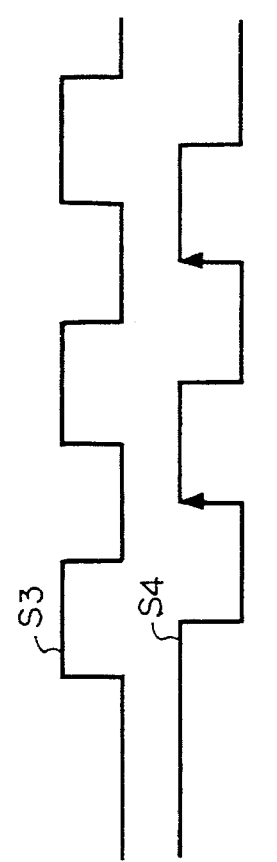
Figure 13D:
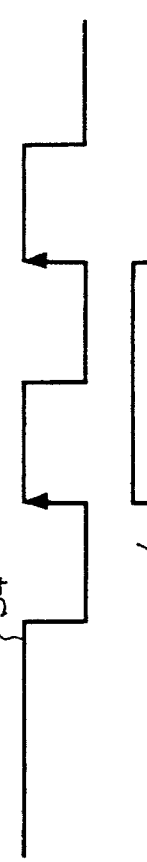
Figure 13E:
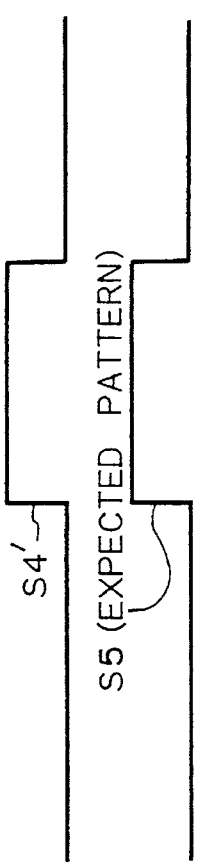
Figure 13F:
Figure 13G:
Figure 13H:
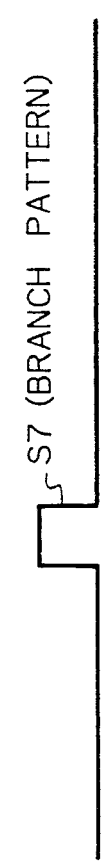
Figure 13I:

First, it is considered that the initial potentials of the output signal S3 of the inverter 101 and the output pattern signal S4 of the counter circuit 1' are low and high, respectively. In this case, the operation of the testing apparatus of FIG. 7 is shown in FIGS. 13A through 13I. That is, the content ADD of the address counter 8 is changed as shown in FIG. 13A, and therefore, the driving pattern signal S1 is changed as shown in FIG. 13B. As a result, the signals S3, S4 and S4' are changed as shown in FIGS. 13C, 13D and 13E, respectively. When the address ADD reached 4, the branch pattern signal S7 is high as shown in FIG. 13H. However, since the output signal S6 of the exclusive OR circuit 5 is low due to the coincidence between the signals S4' and S5 as shown in FIG. 13F, the output of the AND circuit 10 is low, so that the content of the branch address register 11 is not written into the address counter 8. Thus, the content of the address counter 8 is not branched, as shown in FIG. 13A, and accordingly, as shown in FIG. 13I, thereafter a mask pattern signal S8 based upon the mask data of the pattern memory 2 becomes high to determine whether or not the counter circuit 1' is normal.

Next, it is considered that the initial potentials of the output signal S3 of the inverter 101 and the output pattern signal S4 of the counter circuit 1' are high and low, respectively. In this case, the operation of the testing apparatus of FIG. 11 is shown in FIG. 14A through 14I. That is, the content ADD of the address counter 8 is changed as shown in FIG. 14A, and therefore, the driving pattern signal S1 is changed as shown in FIG. 14B. As a result, the signals S3, S4 and S4' are changed as shown in FIGS. 14C, 14D and 14E, respectively. When the address ADD reaches 4, the branch pattern signal S7 is high as shown in FIG. 14H. In this case, since the output signal S6 of the exclusive OR circuit 5 is high due to the noncoincidence between the signals S4 and S5 are shown in Fig. 7F, the output of the AND circuit 10 is high, so that the content of the branch address register 11, i.e., 7 is written into the address counter 8. Thus, the content of the address counter 8 is branched from 4 to 7, as shown in FIG. 14A, and accordingly, as shown in FIG. 14I, the mask pattern signal S8 based upon the mask data of the pattern memory 2 is made high to determine whether or not the counter circuit 1' is normal.

Thus, according to the first embodiment as illustrated in FIG. 11, a phasing function between the divided output pattern signal S4' and the expected pattern signal S5 is initially carried out by introducing a branch address into the address counter 8. Therefore, even when the divided output pattern signal S4' and the expected pattern signal S5 are out of phase, they are automatically in phase at an initial stage of operation.

Figure 15:
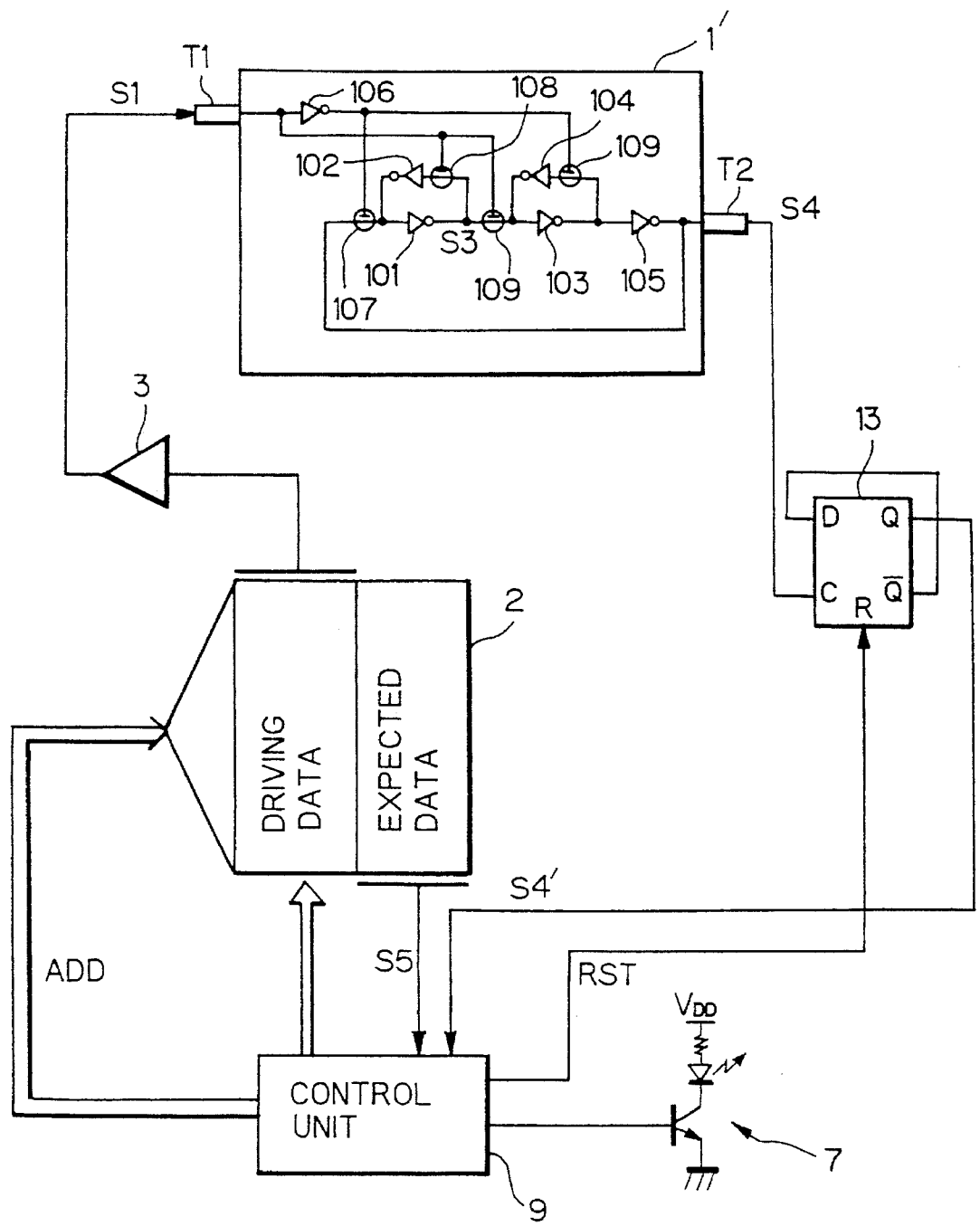
FIG. 15 is a circuit diagram illustrating a fourth embodiment of the testing apparatus for a counter circuit according to the present invention.

In FIG. 15, which illustrates a fourth embodiment of the present invention the exclusive OR circuit 5, the latch circuit 6, the address counter 8, the AND circuit 10, the branch address register 11 and the AND circuit 12 of the FIG. 11 are functionally introduced into the control unit a, i.e., the operation of this hardware is carried out by software. Also, the branch data and mask data of the pattern memory 2 are functionally introduced into the control unit 9.

Figure 16:
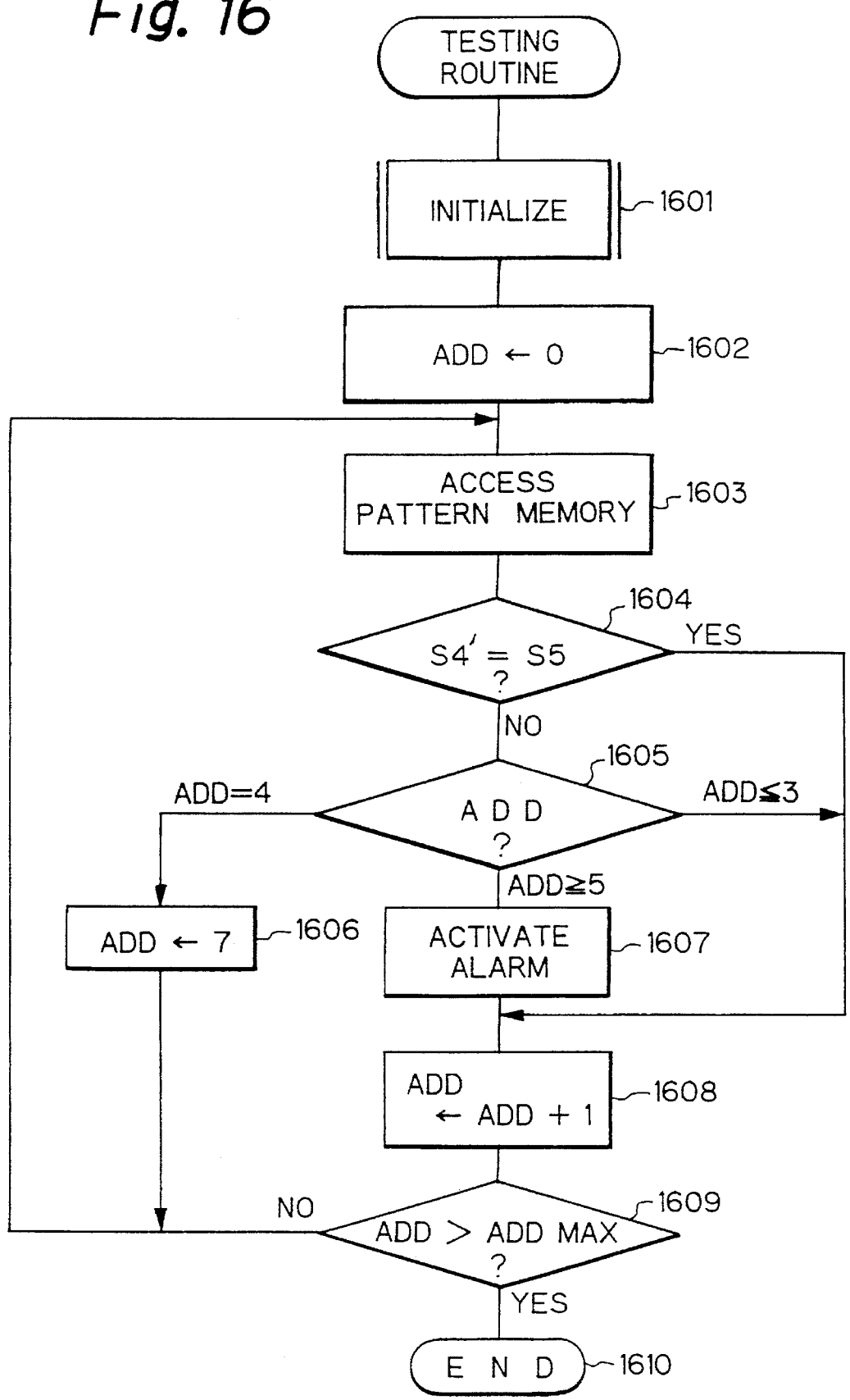
FIG. 16 is a flowchart showing the operation of the control unit of FIG. 15.

The operation of the control unit 9 of FIG. 15 is explained with reference to FIG. 16. At step 1601, an initialization is carried out. For example, data is written into the pattern memory 2. At step 1602, an address counter ADD is cleared.

At step 1603, the pattern memory 2 is accessed by using the value ADD, to generate a driving pattern signal S1 as shown in FIG. 13B or 14B. As a result, the counter circuit 1' is operated to generate an output pattern signal S4 as shown in FIG. 13D or 13D. This output pattern signal S4 is divided by the ½ counter 13 to generate a divided output pattern signal S4' as shown in FIG. 13E or 14E.

At step 1604, it is determined whether or not the divided output pattern signal S4' coincides with the expected pattern signal S5, i.e., they are in-phase with each other, If S4'=S5, the control proceeds to step 1608. Otherwise, the control proceeds to step 1605.

At step 1605, the value of the address counter ADD is determined. When ADD≦3, the control proceeds to step 1608. When ADD=4, the control proceeds to step 1606 which makes the value of the address counter ADD the branch address which is, in this case, 7, and then, the control returns to step 1603. When ADD is larger than 2, the control proceeds to step 1607 which activates the alarm 7, thus indicating that the counter circuit 1' is abnormal. Then, the control proceeds to step 1608.

At step 1608, the value of the address counter ADD is counted up by +1. Then, at step 1609, it is determined whether or not the value of the address counter ADD reached a maximum value ADDMAX. When ADD≦ADDMAX, the control returns to step 1603, thus repeating the above-mentioned operation. Otherwise, the control proceeds to step 1610, thus completing the routine of FIG. 16.

Thus, the testing apparatus of FIG. 15 can be operated in the same way as the testing apparatus of FIG. 11.

In the above-mentioned embodiments, note that the counter circuit 1' can be other counters such as a 1/N counter (N=4, 8 , . . .). Also, in the third and fourth embodiments, the ½ counter 13 can be other counters such as a 1/N counter.

As explained hereinbefore, according to the present invention, since a reset element is unnecessary in a tested counter circuit, it is possible to test it at a high speed. Also, the tested counter circuit can be reduced in size.

I claim:

1. An apparatus for testing a counter circuit, comprising:

means for supplying a count signal to said counter circuit;

means for generating a first expected value in synchronization with said count signal;

means for determining whether a count value of said counter circuit coincides with said first expected value;

means for generating a second expected value, different from said first expected value, in synchronization with said count signal, when said count value of said counter circuit does not coincide with said first expected value;

means for determining whether said count value of said counter circuit coincides with said second expected value; and means for generating a detection signal, when said count value of said counter circuit does not coincide with said second expected value.

2. An apparatus as set forth in claim 1, further comprising means for frequency-dividing said count value of said counter circuit.

3. An apparatus for testing a counter circuit, comprising:

means for supplying a driving signal to said counter circuit;

means for generating a first expected signal in synchronization with said driving signal;

means for comparing a count signal of said counter circuit with said first expected signal for a first time period;

means for generating a second expected signal in synchronization with said driving signal and for stopping generation of said first expected signal, said second expected signal being different in phase from said first expected signal, when said count signal is determined to be different from said first expected signal for said first time period;

means for comparing said count signal of said counter circuit with said second expected signal; and means for generating an alarm signal when said count signal of said counter circuit is different from one of said first and second expected signals.

4. An apparatus as set forth in claim 3, further comprising means for prohibiting generation of said alarm signal for said first time period and before said first time period.

5. An apparatus as set forth in claim 3, further comprising means for frequency-dividing said count signal of said counter circuit.

6. An apparatus for testing a circuit, comprising:

an address counter for generating an address signal;

a pattern memory for storing a test pattern, a plurality of expected values corresponding to addresses accessed by said address signal, and for storing a first routine and a second routine;

a branch address register for storing a first address of said first routine;

means for supplying said test pattern to an input terminal of said circuit;

means for comparing an output signal value of said circuit with a first expected value corresponding to addresses accessed by said address signal, generating a first logic level signal when said output signal value is the same as said first expected value and generating a second logic level signal when said output signal value is different from said first expected value;

means for storing a first address of said second routine in said address counter when a last address of said first routine is being read and said first logic level signal is being generated and for storing said first address of said first routine in said address counter when said last address of said first routine is being read and said second logic level signal is being generated; and means for generating a predetermined signal when said second routine is being read and said second logic level signal is being generated.

* * * * *